Figure 1:
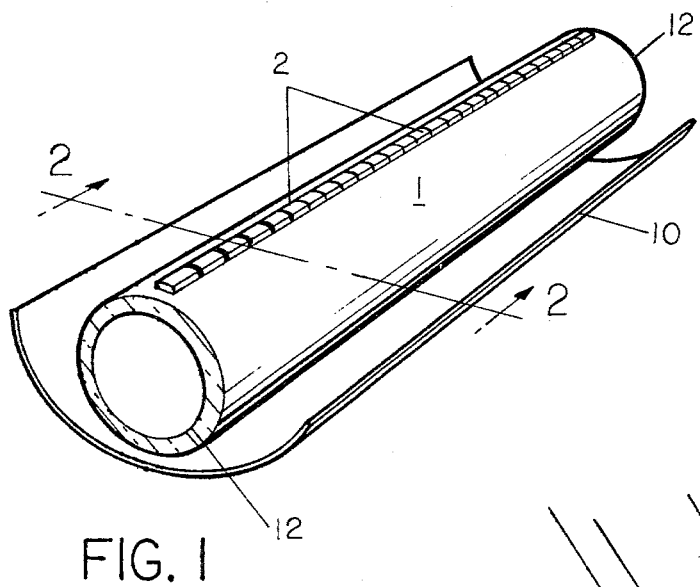

United States Patent [19]

Oster, Jr.

[11] 4,251,284
[45] Feb. 17, 1981

[54] TUBULAR LUMINESCENT SOLAR COLLECTOR-PHOTOCELL STRUCTURE

[75] Inventor: Eugene A. Oster, Jr., Toledo, Ohio

[73] Assignee: Owens-Illinois, Inc., Toledo, Ohio

[21] Appl. No.: 917,121

[22] Filed: Jun. 19, 1978

[51] Int. Cl.³ .......................................... H01L 31/00
[52] U.S. Cl. ................................................ 136/247
[58] Field of Search ......... 136/89 PC, 89 HY, 89 FC, 136/89 CA, 89 CL; 250/227

[56] References Cited
U.S. PATENT DOCUMENTS

| | | | |
|---|---|---|---|
| 3,934,148 | 1/1976 | Collins | 250/458 |
| 3,990,914 | 11/1976 | Weinstein et al. | 136/89 |
| 4,110,123 | 8/1978 | Goetzberger et al. | 136/89 HY |
| 4,130,445 | 12/1978 | Blieden | 136/89 PC |

*Primary Examiner*—Aaron Weisstuch
*Attorney, Agent, or Firm*—Charles S. Lynch; Myron E. Click; David H. Wilson

[57] ABSTRACT

Disclosed is a tubular luminescent solar collector structure containing semiconductor photocells bonded to the surface thereof along the length of said tube.

7 Claims, 6 Drawing Figures

TUBULAR LUMINESCENT SOLAR COLLECTOR-PHOTOCELL STRUCTURE

This invention concerns the art of exposing semiconductors to sunlight to convert at least a part thereof to electrical energy. Such means for converting electromagnetic energy to electricity are known as photovoltaic cells or photocells, and common examples of such photocells are silicon or gallium arsenide semiconductors having P-N junctions. Commonly, an electrical lead is connected on either side of the semiconductor across the P-N junction.

Semiconductor photocells are very expensive, and in consequence, it has been the practice to gather and concentrate the sunlight reaching a given semiconductor photocell so that extremely large areas of semiconductor material need not be employed as would be necessary without such a gathering system. The common gathering systems in the past were optical systems, wherein lens systems concentrated the light and focused same on a given photocell.

However, such a lens system was and is relatively expensive and is not useful in diffuse light on a cloudy day. More recently, however, there has been conceived a different type of collector and concentrator of radiation to be impinged on a semiconductor photocell. For instance, Weber and Lambe in Applied Optics, Vol. 15, pages 2299-2300, Oct. 1976, disclose a system whereby a large area sheet of material, such as a rigid plastic or a glass doped with a luminescent material is exposed to solar radiation. The luminescent medium ideally has a strong absorption for the sun's rays, especially in the visible where the solar spectrum peaks, and it emits electromagnetic radiation of a longer wavelength suitable for activating the semiconductor photocell. A large portion of the light emitted from the luminescent species is in effect trapped in the collector with essentially total internal reflection until the light reaches the area where a photocell, such as a silicon photocell, is optically coupled to a small area, for instance an edge, of the collector. In this way the light from the sun is not only converted to more suitable wavelengths for activation of the photocell but is concentrated since the light received by the large area of the collector escapes only in the small area where the photocell is optically connected to the collector.

Another article, by Levitt and Weber, appearing in Applied Optics, Vol. 16, No. 10, pages 2684—2689, Oct. 1977, should be read with the article first mentioned.

Other publications aiding in the understanding of the setting of the present invention include Goetzberger, Applied Physics, 14, 123-139, 1977, German patent application No. 2620115 published Nov.10, 1977 (not published before our conception, however) and, referred to in the latter patent application, German patent application No. 2554226 published June 8, 1977, which is of some peripheral interest.

Also, numerous patents deal with the conversion of solar energy to different wavelengths by means of luminescent or fluorescent layers and impinging emitted light on a photocell; examples are U.S. Pats. Nos. 3,426,212, 3,484,606 and 3,912,931, which patents, however, do not have the concept of concentrating the light from a large area and collecting it over a much smaller area by optical coupling to a relatively small area semiconductor photocell. In U.S. Pat. No. 3,912,931 benzene and other aromatic hydrocarbons are said to be "fixed" in layers of a silicone resin superimposed on the photocell.

The present invention is concerned with luminescent solar collectors and concentrators which in one sense are of the general type disclosed in the Goetzberger et al. publication, in German application No. 2620115, in the Weber and Lambe paper and in the Levitt and Weber paper. In this last publication, for instance, a square collector 68 mm. on a side and 2.8 mm. thick was given an aluminum mirror coating on three edges and coupled to a Si photovoltaic diode on the fourth edge.

It is an object of the present invention to provide a structure comprising a luminescent solar collector and concentrator physically bonded to and optically coupled with photovoltaic cells.

It is another object to provide such a structure wherein the need for expensive mirrored edges is minimized or eliminated.

Other objects, as well as aspects and advantages of the invention will become apparent from a study of the accompanying disclosure, the drawings and the claims.

These and other objects are attained by providing according to the invention a luminescent solar collector and concentrator comprising a radiation collection medium in the form of an elongated tube having essentially parallel inner and outer wall surfaces of extended area, said medium having at least one layer containing at least one luminescent species capable of emitting luminescent radiation upon excitation with incident solar radiation, said medium being totally internally reflective of a major portion of said emitted luminescent radiation, a relatively small portion of said extended surface area being optically coupled to photovoltaic cells responsive to said emitted radiation. The photocells can be coupled to the outer wall surface or to the inner wall surface. While in cross-section the tube is usually essentially circular it need not be, but as used herein the term tube always means a structure that is curvilinear in cross-section.

In one embodiment of the invention the tube is endless and in the other embodiment the two ends of the tube contain a highly reflective coating on the end edges of the tube in order to reflect most of the electromagnetic radiation reaching said surfaces from within the tube wall. In either embodiment the total area of edges needing application of a reflective coating or mirror compared to the extended surface area of the walls of the tube is much less than in the flat plate construction disclosed, for instance in the Levitt and Weber paper.

Figure 2:
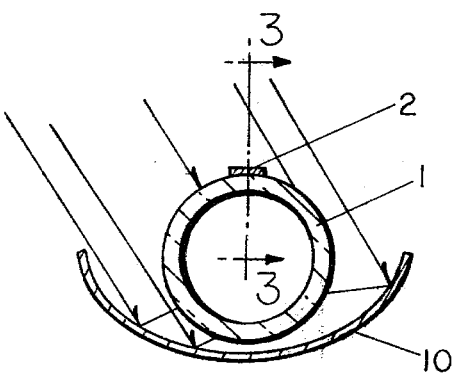
Figure 3:
Figure 4:
Figure 5:
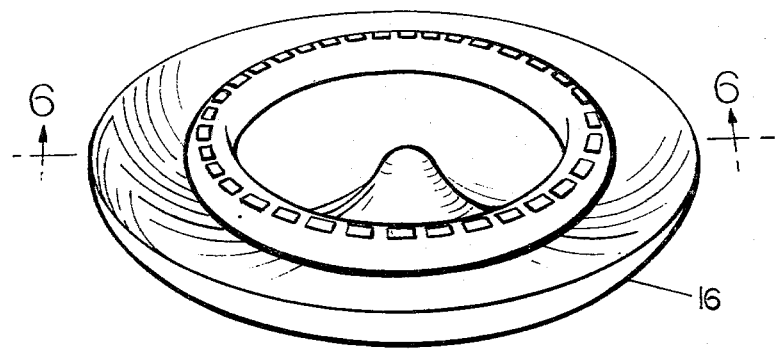
Figure 6:
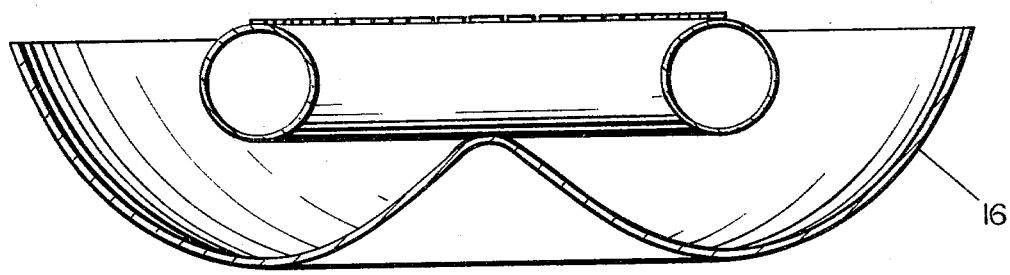

The invention is better understood by reference to the accompanying drawings of which FIG. 1 is a perspective view of one embodiment of the tubular luminescent solar collector and concentrator of the invention, FIG. 2 is a cross-section of FIG. 1 taken along the plane 2—2, while FIG. 3 is a partial cross-section of FIG. 2 taken along the plane 3—3, and FIG. 4 is another version of the partial cross-section of FIG. 3 taken along the plane 3—3 of FIG. 2, and FIG. 5 is a perspective view of another embodiment of the structure of the invention wherein the tubular luminescent solar collector is endless, and FIG. 6 is a cross-sectional view of FIG. 5 taken along the plane 6—6 of FIG. 5.

Turning now to FIGS. 1, 2 and 3, tubular collector 1 made of light-conducting plastic or glass contains a row of photocells 2 along its length. Tubular collector 3 can be a single layer of a homogeneous collection medium such as a glass or a plastic containing a luminescent species, or it can contain more than one luminescent species, each of which is activated by a different range of wavelengths of light. It also can be a composite so that the wall of the tube is made up of layers of physically bonded and optically coupled materials, at least one of which contains at least one luminescent species. This embodiment is shown in FIG. 4. Thus, tube 1 can for instance be a layer 6 of plastic, such as poly(methyl methacrylate) containing a luminescent dye. Layer 8 can be, for instance, a glass layer, containing or not containing a luminescent species, or it can be another layer of the same plastic but containing no luminescent species or a different luminescent species. Advantageously, layer 6 is quite thin, such as one or two mils thick up to say 0.2 mm. thick and the luminescent dye is quite concentrated in the layer when compared to the concentration used in a structure like FIG. 3. The index of refraction of layers 6 and 8 can be the same and in any event are not so far apart as to prevent most of the luminescent rays created in layer 6 from passing into layer 8 and from layer 8 back into layer 6 as it bounces back and forth along the tube wall by the well-known mechanism of total internal reflection of that large percentage of the emitted luminescent rays that are trapped. Of course, in the simple embodiment of a single layer of FIG. 3 the majority of the luminescent radiation also bounces back and forth between the walls of the tube by the same mechanism of total internal reflection. In any event, the photocells, such as silicon photovoltaic cells containing a P-N junction are bonded to the wall of the tube by a bonding agent having an index of refraction close to the index of the refraction of the wall of the tube. For instance, if the tube is made of poly (methyl methacrylate) containing a luminescent dye, the solar cells can be bonded to the outside of the wall by using a cement made up of a solution of the poly (methyl methacrylate) in a solent such as ethylene dichloride, which is thereafter allowed to evaporate. Usually, the surface of the semiconductor photocell facing the collector wall also contains the usual antireflective coating to minimize reflection of a part of the radiation attempting to enter the cell.

As will be understood from a study of the papers and patents discussed hereinbefore, the luminescent radiation created within the tube wall is trapped therein, except for the rays that escape from the surface because they are below the critical angle. The rays that are trapped by total internal reflection are that portion of the rays meeting the surfaces at greater than the critical angle, and because of the large difference between the refractive index of the ambient air and the refractive index of the collection medium of the wall of tubular collector 1, such luminescent radiation bounces back and forth from the inner to outer surface of 1 until it reaches a photocell where, because of the optical coupling, it enters the photocell and creates electricity which is collected by suitable conductors, not shown.

The line of photocells 2 are shown for purposes of illustration as somewhat separated, but it is preferred that the photocells be arranged as close end to end as practicable.

While only one row of photocells along the length of the tube is shown, two or more rows can also be employed in all embodiments of the present invention.

While a mirror is not absolutely necessary to my invention reflector 10 facing and encompassing the bottom portion of tube 1 collects sunlight which is reflected back into the tube. This increases the amount of sunlight collected by a single tube.

Ends 12 of the tube contain a highly reflective coating such as a mirror coating of aluminum or silver for the usual purpose of reflecting back the luminescent radiation so that it does not escape the end edges. As noted, the area of such edges is considerably smaller than would be necessary if the extended surface area of tube 12 were in the form of a flat plate instead of tubular.

FIGS. 5 and 6 depict a particular version of an endless tube luminescent collector-concentrator, in this case in a doughnut shape. The variations with respect to the construction of the luminescent solar collector and concentrator in this version are the same as with respect to FIGS. 1-4, i.e., single or multilayer, each layer of which can contain one or more luminescent species and, as before, only one layer of the composite need contain a luminescent species. Again, the photocells, such as a silicon semiconductor photovoltaic cells containing P-N junctions are arranged along the length of the tube and are desirably arranged nearly touching end to end instead of being physically spaced as shown for illustration purposes. Moreover, more than one row of photocells can be used. The gull wing reflector 16 is a considerable aid in gathering more light for delivery to the luminescent solar collector, but a reflector is not absolutely required in either embodiment of the invention.

While the photocells in the structure of the present invention can be connected either in series or in parallel, it is a preferred embodiment of my invention that the photocells be connected in series, or that at least large groups of the photocells be connected in series, in order to minimize $I^2R$ loss. Thus, if all the photocells are connected in parallel the $I^2R$ loss is relatively high.

As previously noted, the luminescent solar collector tube of the invention preferably has an essentially circular cross-section and it is also preferred that the ratio of the outside diameter of the tube to the wall thickness of the tube be at least 6:1, and higher ratios are even more preferred.

In a specific example a structure like FIGS. 1 and 2 plus 4 is made by diluting a 40 weight percent solution of poly(methyl methacrylate) in an 80:20 weight ratio of toluene to isopropyl alcohol (a commercial product of du Pont trade-named Elvacite 6014) to an 8 weight percent solution of the polymer in more of the same solvent mixture. This solution is spray coated onto the outside of a 3-inch O.D. cylindrical glass tube having a wall thickness of ⅛ inch. Of course, the poly(methyl methacrylate) solution used also contains the luminescent species, namely, 0.15 grams of Coumarin 153 fluorescent dye for each 50 grams of the polymer. Enough coats are sprayed to make a coating 2 mils thick on the outside of the tube. Some of the same polymer solution is painted on the bottom of each of a number of silicon photovoltaic photocells as a cement, and the photocells are then applied in a row to the tube along its length as shown in FIG. 1. The tube is a little longer than 16 inches and each of the 8 photocells which are 2 inches long and ⅛ inch wide are arranged end to end. Suitable electrical connections are applied to connect the cells in series. In operation, the luminescent solar collector tube-photocell assembly is mounted substantially facing the sun outdoors over a highly polished metallic reflector 20 inches long and 12 inches wide and upwardly curved as in FIG. 1. With the very thin luminescent film structure as used in the foregoing example, it is very advantageous and in fact preferred that each luminescent species used has absorption and emission spectra that overlap each other as little as possible, and they preferably do not measurably overlap. Dyes having this characteristic include, for instance, Coumarin 153, Coumarin 6 and Coumarin 151. Coumarin 153 is 1.2.4.5.3H.6H.10H.Tetrahydro-8-trifluoromethyl (1)benzopyrano 9.9a.1-gh)quinolizin-10-one, Coumarin 6 is 3-(2-Benzothizaolyl)-7-N.N-diethylaminocoumarin, and Coumarin 151 is 7-Amino-4-trifluoromethylcoumarin.

Instead of using Coumarin 153 alone in the foregoing example of the invention structure given, it can be used together with Coumarin 6. The luminescent emission spectrum of the latter overlaps the absorption spectrum of Coumarin 153, and on exposure to sunlight the Coumarin 6 output activates the Coumarin 153.

As has been noted, the "radiation collection medium" set forth in the broad statement of the invention can be a composite of more than one layer of radiation transmitting materials, each containing a different luminescent species, such as Coumarin 6 in the top layer and Coumarin 153 in the bottom layer.

As will be evident to those skilled in the art, various modifications of this invention can be made or followed in the light of the foregoing disclosure and discussion without departing from the spirit and scope of the disclosure or from the scope of the claims.

I claim:

1. A luminescent solar collector and concentrator comprising a radiation collection medium in the form of an elongated tube having essentially parallel inner and outer wall surfaces of extended area, said medium having at least one layer containing at least one luminescent species capable of emitting luminescent radiation upon excitation with incident solar radiation, said medium being totally internally reflective of a major portion of said emitted luminescent radiation, and photovoltaic cells, responsive to said emitted radiation, optically coupled to a relatively small portion of said extended surface area.

2. A structure as defined in claim 1 wherein the end edges of said tube contain highly reflective coatings.

3. A structure as defined in claim 1 wherein a mirror is operatively disposed to reflect sunlight from said mirror to said tube.

4. A structure as defined in claim 1 wherein said tube is circular in cross-section and the ratio of the outer diameter of the tube to the wall thickness is at least 6.

5. A structure as defined in claim 4 wherein a mirror is operatively disposed to reflect sunlight from said mirror to said tube.

6. A luminescent solar collector and concentrator comprising a radiation collection medium in the form of an endless elongated tube having essentially parallel inner and outer wall surfaces of extended area, said medium having at least one layer containing at least one luminescent species capable of emitting luminescent radiation upon excitation with incident solar radiation, said medium being totally internally reflective of a major portion of said emitted luminescent radiation, and photovoltaic cells, responsive to said emitted radiation, optically coupled to a relatively small portion of said extended surface area.

7. A structure as defined in claim 6 wherein a mirror is operatively disposed to reflect sunlight from said mirror to said tube.

* * * * *